United States Patent [19]

Beneking et al.

[11] Patent Number: 4,563,772
[45] Date of Patent: Jan. 7, 1986

[54] HIGH FREQUENCY MIXER STAGE

[75] Inventors: Heinz Beneking, Aachen; Rainer Stahlmann, Aachen-Richterich, both of Fed. Rep. of Germany; Christos Tsironis, Montgeron, France

[73] Assignee: Licentia Patent-Verwaltungs-GmbH, Frankfurt am Main, Fed. Rep. of Germany

[21] Appl. No.: 491,940

[22] Filed: May 5, 1983

[30] Foreign Application Priority Data

May 5, 1982 [DE] Fed. Rep. of Germany ....... 3216776

[51] Int. Cl.$^4$ ............................................. H04B 1/26
[52] U.S. Cl. ................................... 455/321; 455/333
[58] Field of Search ............... 455/313, 323, 324, 321, 455/333

[56] References Cited

U.S. PATENT DOCUMENTS 3,348,155 10/1967 Recklinghausen .
3,803,461 4/1974 Beneking .
4,112,373 9/1978 Miyamoto et al. .

FOREIGN PATENT DOCUMENTS 0057480 8/1982 European Pat. Off. .
1541607 10/1970 Fed. Rep. of Germany .
2159592 12/1981 Fed. Rep. of Germany .
52-34532 12/1978 Japan .
52-34533 12/1978 Japan .
1100082 1/1968 United Kingdom .
1146671 3/1969 United Kingdom .
1543363 4/1979 United Kingdom .

OTHER PUBLICATIONS

"Transistor-Oszillator Ohne Rückkopplung"-Ortler, 5/1982, Funkschau, pp. 85-88.
"New Tetrode F.E.T. Attains 8000 μmhos"—Electronics—Feb. 7, 1966, p. 60.
"Der Einsatz von MOS-Feldeffectransistoren im UKW-Tuner"-by Lessen in Radio Fernsehen Elektronik, 1970, pp. 740, 741, 748.

Primary Examiner—Marc E. Bookbinder
Attorney, Agent, or Firm—Spencer & Frank

[57] ABSTRACT

The invention relates to a high frequency mixer stage comprising a field-effect transistor tetrode having two gate electrodes, with one gate electrode being supplied with the high frequency input signal. According to the invention, the mixer stage becomes a frequency changer by means of inductive load at the second gate electrode of the tetrode.

3 Claims, 1 Drawing Figure

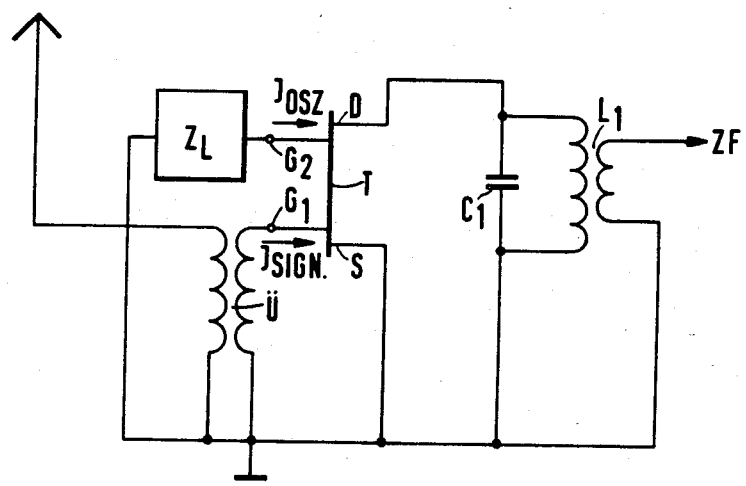

HIGH FREQUENCY MIXER STAGE

BACKGROUND OF THE INVENTION

The invention relates to a high frequency mixer stage comprising a field-effect transistor tetrode having two gate electrodes, with the high frequency input signal being fed to one of the gate electrodes. A mixer stage of this type is known, for example, from DE-PS German Pat. No. 21 59 592. In the known circuit, a field-effect transistor tetrode is combined with an ordinary field-effect transistor. The high frequency input signal is fed to one gate electrode of the tetrode, while the oscillator frequency from a parallel resonant circuit is fed to the second gate electrode of the tetrode. Connected to the drain electrode of the tetrode is a further parallel resonant circuit with which the intermediate frequency component is filtered out and coupled out inductively.

The known circuit is relatively sophisticated, since in addition to the tetrode a further field-effect transistor is required and a special local oscillator must be provided.

SUMMARY OF THE INVENTION

The object underlying the invention is to provide a high frequency mixer stage which is of particularly simple and easy-to-integrate design.

According to the invention there is provided a high frequency mixer stage wherein the operating point of the tetrode at the second gate electrode is set such that the mixer stage is converted into a frequency changer by the self-excitation which occurs.

This self-excitation is preferably produced by means of an inductive load at the second gate electrode. A GaAs barrier layer field-effect transistor is, for example, suitable as tetrode.

The high frequency mixer stage according to the invention is of extremely simple construction because the single active component determined by the tetrode replaces the preliminary and high frequency amplifiers, respectively, the local oscillator and the mixer. The tetrode is very simple to produce in a manner known per se in integrated semiconductor technology.

DESCRIPTION OF THE PREFERRED EMBODIMENT

The invention will now be described in greater detail, by way of an example, with reference to the drawing where the FIGURE is a view of a preferred circuit for the high frequency mixer stage.

A tetrode T with the two gate electrodes $G_1$ and $G_2$ is shown in the FIGURE. This tetrode is, for example, a GaAs MESFET which can be employed in the 10 GHz range. The high frequency input signal is fed to the gate electrode $G_1$ via the transformer Ü, while the oscillator frequency $f_{osz}$ decoupled therefrom is fed to the gate electrode $G_2$. This local oscillator frequency is generated by means of an inductive load $Z_L$. Between the drain and source electrodes of the tetrode there is a parallel resonant circuit which is comprised of the capacitor $C_1$ and the inductance coil $L_1$ and is aligned to the differential frequency between the oscillator frequency and the input signal frequency. The intermediate frequency ZF is inductively coupled out of this parallel resonant circuit.

In one embodiment, a tetrode with the following transistor characteristics was used:

GaAs MESFET tetrode with a channel width of 200 μm and gate electrodes with a length of 1 μm (gate 1) and 2 μm (gate 2), respectively;

saturation current $I_{DSS}=25$ mA, maximum oscillation frequency $f_{max}=20$ GHz, transconductance at gate 1 $g_{m1}=15$ mS ($u_{g2}=0$).

transconductance at gate 2 $g_{m2}=10$ mS ($u_{g1}=0$).

The gate electrode $G_2$ was loaded with an inductive load $|Z_L|$ in the order of 56Ω to generate the oscillator frequency $f_{osz}$. The oscillator frequency then amounted to 9.0 GHz. With a signal frequency $f_{sign}$ of 10.08 GHz there is an intermediate frequency ZF in the order of 1.08 GHz which is filtered out at the resonant circuit $C_1$, $L_1$.

We claim:

1. High frequency mixer stage comprising a field-effect transistor tetrode with two gate electrodes, means supplying a high frequency input signal to one of the gate electrodes, and two terminal means connected between the second gate electrode ($G_2$) and a ground terminal for setting operating point of the tetrode such that self-oscillation and, consequently, frequency conversion occurs substantially due to cooperation of said tetrode and said two-terminal means, wherein said two terminal means is an inductive load.

2. High frequency mixer stage according to claim 1, wherein the tetrode is a GaAs barrier layer field-effect transistor.

3. High frequency mixer stage according to claim 1 wherein said tetrode has a source electrode connected to said circuit ground.

* * * * *